United States Patent
Chung et al.

(10) Patent No.: US 9,673,814 B2
(45) Date of Patent: Jun. 6, 2017

(54) SEMICONDUCTOR DEVICES AND SEMICONDUCTOR SYSTEMS INCLUDING THE SAME

(71) Applicant: SK hynix Inc., Icheon-si, Gyeonggi-do (KR)

(72) Inventors: Won Kyung Chung, Icheon-si (KR); Saeng Hwan Kim, Suwon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 14/939,699

(22) Filed: Nov. 12, 2015

(65) Prior Publication Data
US 2017/0033791 A1    Feb. 2, 2017

(30) Foreign Application Priority Data
Jul. 27, 2015    (KR) .................. 10-2015-0106093

(51) Int. Cl.
| H03B 1/00 | (2006.01) |
| H03K 3/00 | (2006.01) |
| H03K 17/687 | (2006.01) |
| G11C 7/22 | (2006.01) |
| G11C 7/10 | (2006.01) |

(52) U.S. Cl.
CPC ......... *H03K 17/687* (2013.01); *G11C 7/1045* (2013.01); *G11C 7/22* (2013.01)

(58) Field of Classification Search
USPC ............................................... 327/108–112
See application file for complete search history.

(56) References Cited

U.S. PATENT DOCUMENTS

| 4,511,888 | A | * | 4/1985 | Bernhardt | .......... | G08B 13/2431 340/571 |
| 4,559,529 | A | * | 12/1985 | Bernhardt | .......... | G08B 13/2431 340/568.7 |
| 6,330,192 | B1 | * | 12/2001 | Ohba | ................. | G11C 16/3404 365/185.22 |
| 6,388,921 | B1 | * | 5/2002 | Yamamoto | ......... | G11C 16/0416 257/E21.69 |
| 6,970,385 | B2 | * | 11/2005 | Sakakibara | ........ | G11C 16/3404 365/148 |
| 8,582,363 | B2 | * | 11/2013 | Lee | .................... | G11C 16/3409 365/185.11 |
| 8,705,273 | B2 | * | 4/2014 | Kim | ......................... | G11C 5/14 365/185.03 |

(Continued)

FOREIGN PATENT DOCUMENTS

| KR | 1020080100948 A | 11/2008 |
| KR | 1020100067806 A | 6/2010 |
| KR | 1020110130068 A | 12/2011 |

*Primary Examiner* — Adam Houston
(74) *Attorney, Agent, or Firm* — William Park & Associates Ltd.

(57) ABSTRACT

A semiconductor system may include a first semiconductor device and a second semiconductor device. The first semiconductor device may output set signals. The second semiconductor device may generate a start signal in response to the set signals, generate an input control code and an output control code from the set signals in response to the start signal, generate a frequency determination signal including information on an operation frequency in response to the output control code, and control an internal operation in response to the frequency determination signal.

38 Claims, 9 Drawing Sheets

(56) References Cited

U.S. PATENT DOCUMENTS

| | | | |
|---|---|---|---|
| 9,019,784 B2* | 4/2015 | Park | G11C 7/1078 |
| | | | 365/189.16 |
| 9,405,313 B2* | 8/2016 | Ko | G11C 7/222 |
| 9,417,998 B2* | 8/2016 | Mylly | G06F 12/0246 |
| 2004/0057324 A1 | 3/2004 | Abe et al. | |
| 2008/0299967 A1* | 12/2008 | Kazmi | H04L 41/5029 |
| | | | 455/433 |
| 2015/0362947 A1* | 12/2015 | Tripathi | G09G 5/006 |
| | | | 713/400 |
| 2016/0216704 A1* | 7/2016 | Koh | G05B 19/0425 |
| 2017/0033791 A1* | 2/2017 | Chung | G11C 7/22 |

\* cited by examiner

FIG. 3

| WR_CD | OP_CD | WR<1> | OP<1> | WR<2> | OP<2> |
|---|---|---|---|---|---|
| L | L | H | L | L | L |
| L | H | L | H | L | L |
| H | L | L | L | H | L |
| H | H | L | L | L | H |

SEMICONDUCTOR DEVICES AND SEMICONDUCTOR SYSTEMS INCLUDING THE SAME

CROSS-REFERENCE TO RELATED APPLICATIONS

The present application claims priority under 35 U.S.C. 119(a) to Korean Patent Application No. 10-2015-0106093, filed on Jul. 27, 2015, in the Korean Intellectual Property Office, which is incorporated herein by reference in its entirety as set forth in full.

BACKGROUND

1. Technical Field

Embodiments of the present disclosure generally relate to semiconductor devices operating at various frequencies and semiconductor systems including the same.

2. Related Art

In general, a semiconductor system including a semiconductor device may operate at not only a single frequency but with various frequencies. An operation speed of the semiconductor system may vary according to an operation frequency of the semiconductor system. Thus, the power consumption of the semiconductor system may also vary according to the operation frequency of the semiconductor system. For example, the operation speed of the semiconductor system may become faster to increase the power consumption if the semiconductor system operates at a relatively high frequency. In contrast, the operation speed of the semiconductor system may become slower to reduce the power consumption if the semiconductor system operates at a relatively low frequency.

In order for the semiconductor system to operate at a high frequency, the semiconductor system has to be designed to have an excellent alternating current (AC) specification. An excellent AC specification of the semiconductor system means that the semiconductor system is designed to have a high operation speed and a high amplification gain. If the operation frequency of the semiconductor system is set to high, an allowable range of the operation frequency may be reduced.

In order to increase a range of the operation frequency of the semiconductor system, the semiconductor system has to be designed to meet the AC specification which is set at the highest frequency in an allowable range of the operation frequency. However, in such a case, a power consumption of the semiconductor system may increase.

SUMMARY

According to an embodiment, a semiconductor system may be provided. The semiconductor system may include a first semiconductor device and a second semiconductor device. The first semiconductor device may output set signals. The second semiconductor device may generate a start signal in response to the set signals, generates an input control code and an output control code from the set signals in response to the start signal, generate a frequency determination signal including information on an operation frequency in response to the output control code, and control an internal operation in response to the frequency determination signal.

According to an embodiment, a semiconductor system may be provided. The semiconductor system may include a first semiconductor device and a second semiconductor device. The first semiconductor device may output set signals. The second semiconductor device may generate a mode register write command in response to the set signals, extract and store an information signal including information on an operation frequency from the set signals in response to the mode register write command, generate a frequency determination signal from the information signal, and control an internal operation in response to the frequency determination signal.

According to an embodiment, a semiconductor device may be provided. The semiconductor device may include a code extraction circuit configured for generating an input control code and an output control code in response to set signals. The semiconductor device may include a frequency determination signal generation circuit configured for generating a frequency determination signal including information on an operation frequency in response to the output control code. The semiconductor device may include an operation control circuit configured for controlling an internal operation in response to the frequency determination signal.

According to an embodiment, a semiconductor device may be provided. The semiconductor device may include a mode register configured for extracting and storing an information signal from set signals in response to a mode register write command. The semiconductor device may include a frequency determination signal generation circuit configured for generating a frequency determination signal including information on an operation frequency from the information signal. The semiconductor device may include an operation control circuit configured for controlling an internal operation in response to the frequency determination signal.

According to an embodiment, a semiconductor system may be provided. The semiconductor system may include a first semiconductor device configured to output set signals and a second semiconductor device. The second semiconductor device may include a frequency determination signal generation circuit configured for generating a frequency determination signal including information on an operation frequency in response to set signals. The second semiconductor device may include an operation control circuit configured for controlling an internal operation in response to the frequency determination signal.

BRIEF DESCRIPTION OF THE DRAWINGS

FIG. 3 is a logic table illustrating a representation of an example of an operation of the information storage circuit illustrated in FIG. 2.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Various embodiments may be directed to semiconductor devices and semiconductor systems including the same.

Figure 1:
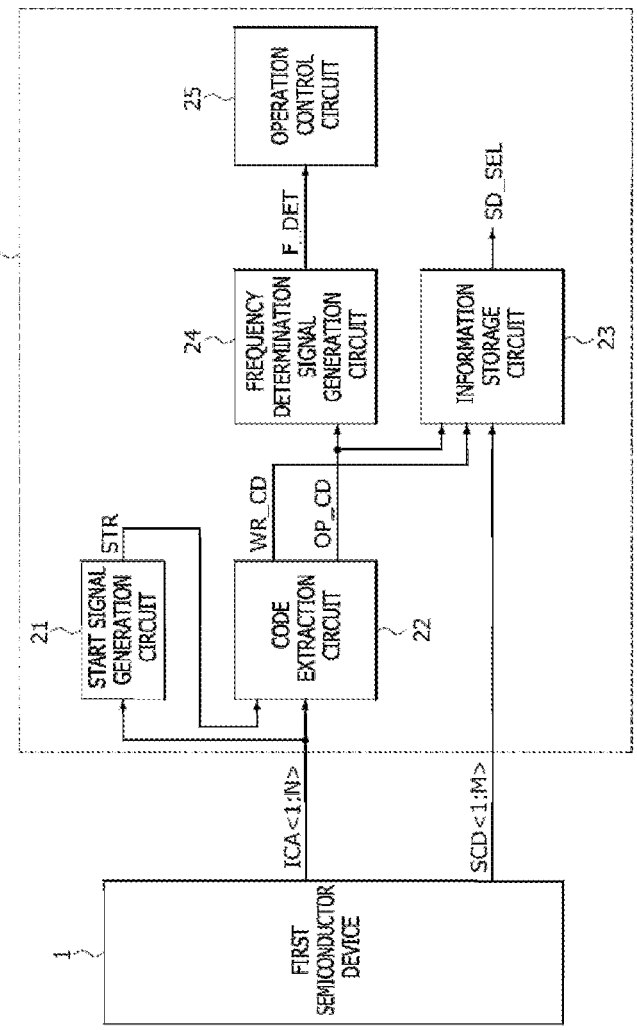
FIG. 1 is a block diagram illustrating a representation of an example of a configuration of a semiconductor system according to an embodiment.

Referring to FIG. 1, a semiconductor system according to an embodiment may include a first semiconductor device 1 and a second semiconductor device 2.

The first semiconductor device 1 may output set signals ICA<1:N> and set codes SCD<1:M> (i.e., N and M may be any natural number lager than '1'). The set signals ICA<1:N> may be set to have various logic level combinations. A start signal STR may be enabled or disabled according to a logic level combination of the set signals ICA<1:N>. Logic levels of an input control code WR_CD and an output control code OP_CD may be set according to a logic level combination of the set signals ICA<1:N>. The set signals ICA<1:N> may be transmitted through lines that transmit commands or simultaneously transmit the commands and addresses. The number of bits included in the set signals ICA<1:N> may be set to be different according to the embodiments. The number of bits included in the set codes SCD<1:M> may be set to be different according to the embodiments. The set codes SCD<1:M> may be transmitted through lines that transmit at least one group among the addresses, the commands and data. Although FIG. 1 illustrates an example in which the set signals ICA<1:N> and the set codes SCD<1:M> are transmitted through separate signal lines, the present disclosure is not limited thereto. For example, the set signals ICA<1:N> and the set codes SCD<1:M> may be transmitted through the same signal lines according to the embodiments.

The second semiconductor device 2 may include a start signal generation circuit 21, a code extraction circuit 22, an information storage circuit 23, a frequency determination signal generation circuit 24 and an operation control circuit 25.

The start signal generation circuit 21 may receive the set signals ICA<1:N> to generate the start signal STR. For example, the start signal generation circuit 21 may generate the start signal STR which is enabled if the set signals ICA<1:N> having a predetermined logic level combination are inputted thereto. In some embodiments, the start signal generation circuit 21 may receive signals of some bits among a plurality of bits included in the set signals ICA<1:N> to generate the start signal STR. A logic level of the enabled start signal STR may be set differently according to the embodiments.

The code extraction circuit 22 may extract the input control code WR_CD and the output control code OP_CD from the set signals ICA<1:N> and may output the input control code WR_CD and the output control code OP_CD, in response to the start signal STR. For example, the code extraction circuit 22 may extract the input control code WR_CD and the output control code OP_CD from the set signals ICA<1:N> if the start signal STR is enabled. For example, the code extraction circuit 22 may be configured to generate the input control code and the output control code, one of either the input control code WR_CD or the output control code OP_CD may be selectively enabled according to a logic level combination of the set signals ICA<1:N> if the start signal STR is, for example, enabled. A design scheme for extracting the input control code WR_CD and the output control code OP_CD from the set signals ICA<1:N> may be set differently according to the embodiments. For example, in some embodiments, the input control code WR_CD and the output control code OP_CD may be included in the set signals ICA<1:N> without any signal processing and may be transmitted by sending the set signals ICA<1:N>. Alternatively, the input control code WR_CD and the output control code OP_CD may be processed by a signal processor and the processed input control code WR_CD and the processed output control code OP_CD may be transmitted together with the set signals ICA<1:N>. The input control code WR_CD and the output control code OP_CD may be realized to have at least two bits according to the embodiments. The code extraction circuit 22 may be realized to receive only some bits among a plurality of bits included in the set signals ICA<1:N> for extraction of the input control code WR_CD and the output control code OP_CD.

The information storage circuit 23 may extract and store operation information according to frequencies from the set codes SCD<1:M> and may output a selection information signal SD_SEL, in response to the input control code WR_CD and the output control code OP_CD. For example, the information storage circuit 23 may store the information on a high frequency operation or a low frequency operation included in the set codes SCD<1:M> according to a logic level of the input control code WR_CD and may output the stored information as the selection information signal SD_SEL according to a logic level of the output control code OP_CD. For example, the information storage circuit 23 may store the information on a high frequency operation if the input control code WR_CD has a logic "high" level, and the information storage circuit 23 may store the information on a low frequency operation if the input control code WR_CD has a logic "low" level. The information stored in the information storage circuit 23 according to a logic level of the input control code WR_CD may be set differently according to the embodiments. The information storage circuit 23 may output the information stored therein according to a logic level of the output control code OP_CD. For example, the information storage circuit 23 may output the information on a high frequency operation if the output control code OP_CD has a logic "high" level, and the information storage circuit 23 may output the information on a low frequency operation if the output control code OP_CD has a logic "low" level. The information outputted from the information storage circuit 23 according to a logic level of the output control code OP_CD may be set differently according to the embodiments.

The frequency determination signal generation circuit 24 may extract information on an operation frequency from a logic level of the output control code OP_CD. For example, the frequency determination signal generation circuit 24 may generate a frequency determination signal F_DET having a logic "high" level if the output control code OP_CD has a logic "high" level and may generate the frequency determination signal F_DET having a logic "low"

level if the output control code OP_CD has a logic "low" level. A logic level of the frequency determination signal F_DET generated from the frequency determination signal generation circuit 24 according to a logic level of the output control code OP_CD may be set differently according to the embodiments. The semiconductor system may operate at a high frequency if the frequency determination signal F_DET has a logic "high" level and may operate at a low frequency if the frequency determination signal F_DET has a logic "low" level. The operation frequency of the semiconductor system determined according to a logic level of the frequency determination signal F_DET may be set differently according to the embodiments.

The operation control circuit 25 may control the semiconductor system in response to the frequency determination signal F_DET so that the semiconductor system operates at a high frequency or a low frequency. For example, the operation control circuit 25 may control the semiconductor system so that the semiconductor system operates at a high frequency if the frequency determination signal F_DET has a logic "high" level and operates at a low frequency if the frequency determination signal F_DET has a logic "low" level. The operations controlled by the operation control circuit 25 according to a logic level of the frequency determination signal F_DET may be set differently according to the embodiments. The operations executed at a high frequency may include, for example but are not limited to, an operation for increasing a drivability of a buffer circuit (not illustrated) and an operation for lowering a threshold voltage of metal-oxide-semiconductor (MOS) transistors (not illustrated) to improve an operation speed of the MOS transistors. In an embodiment, the operations executed at a low frequency may include, for example but are not limited to, an operation for reducing a drivability of the buffer circuit and an operation for increasing a threshold voltage of the MOS transistors to degrade an operation speed of the MOS transistors.

Figure 2:
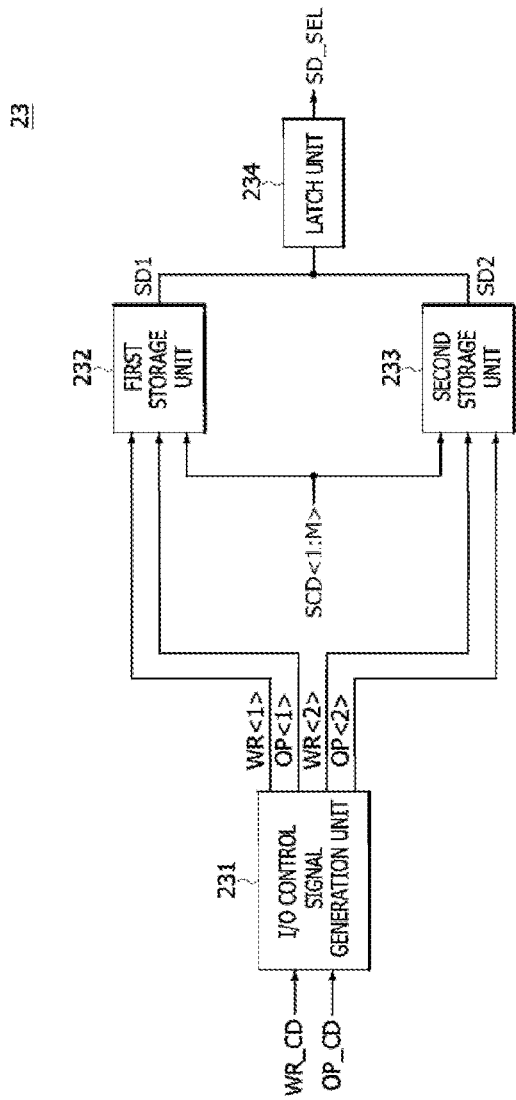
FIG. 2 is a block diagram illustrating a representation of an example of a configuration of an information storage circuit included in the semiconductor system of FIG. 1.

Referring to FIG. 2, the information storage circuit 23 may include an input/output (I/O) control signal generation unit 231, a first storage unit 232, a second storage unit 233 and a latch unit 234.

The I/O control signal generation unit 231 may generate a first input control signal WR<1>, a second input control signal WR<2>, a first output control signal OP<1> and a second output control signal OP<2> in response to the input control code WR_CD and the output control code OP_CD. For example, the I/O control signal generation unit 231 may generate the first input control signal WR<1> which is enabled to have a logic "high" level if the input control code WR_CD has a logic "low" level and the output control code OP_CD has a logic "low" level, and the I/O control signal generation unit 231 may generate the second input control signal WR<2> which is enabled to have a logic "high" level if the input control code WR_CD has a logic "high" level and the output control code OP_CD has a logic "low" level. An enabled level and a disabled level of each of the first and second input control signals WR<1> and WR<2> generated from the I/O control signal generation unit 231 according to a logic level of the input control code WR_CD may be set differently according to the embodiments. For example, in some embodiments, the first and second input control signals WR<1> and WR<2> may be set to be enabled to a logic "low" level. In addition, the I/O control signal generation unit 231 may generate the first output control signal OP<1> which is enabled to have a logic "high" level if the input control code WR_CD has a logic "low" level and the output control code OP_CD has a logic "high" level, and the I/O control signal generation unit 231 may generate the second output control signal OP<2> which is enabled to have a logic "high" level if the input control code WR_CD has a logic "high" level and the output control code OP_CD has a logic "high" level. An enabled level and a disabled level of each of the first and second output control signals OP<1> and OP<2> generated from the I/O control signal generation unit 231 according to a logic level of the output control code OP_CD may be set differently according to the embodiments. For example, in some embodiments, the first and second output control signals OP<1> and OP<2> may be set to be enabled to a logic "low" level.

The first storage unit 232 may store the information on a high frequency operation included in the set codes SCD<1:M> if the first input control signal WR<1> is enabled. The first storage unit 232 may output the information on a high frequency operation stored therein as a first storage signal SD1 if the first output control signal OP<1> is enabled. In some other embodiments, the first storage unit 232 may store the information on a low frequency operation included in the set codes SCD<1:M> if the first input control signal WR<1> is enabled, and the first storage unit 232 may output the information on a low frequency operation stored therein as the first storage signal SD1 if the first output control signal OP<1> is enabled.

The second storage unit 233 may store the information on a low frequency operation included in the set codes SCD<1:M> if the second input control signal WR<2> is enabled. The second storage unit 233 may output the information on a low frequency operation stored therein as a second storage signal SD2 if the second output control signal OP<2> is enabled. In some other embodiments, the second storage unit 233 may store the information on a high frequency operation included in the set codes SCD<1:M> if the second input control signal WR<2> is enabled, and the second storage unit 233 may output the information on a high frequency operation stored therein as the second storage signal SD2 if the second output control signal OP<2> is enabled.

The latch unit 234 may latch the first or second storage signal SD1 or SD2 to output the latched signal as the selection information signal SD_SEL. The selection information signal SD_SEL may include information for executing various operations including, for example but not limited to, a read operation and a write operation. The selection information signal SD_SEL may further include, for example but not limited to, information on a reference voltage, information on a burst type, information on a burst length, information on a write latency, information on a read latency, information on a preamble, information on a postamble, information on a driver strength, information on data bus inversion and information on on-die-termination (ODT), etc.

An operation of the information storage circuit 23 will be described hereinafter with reference to FIG. 3. If both of the input control code WR_CD and the output control code OP_CD have a logic "low" level, the first input control signal WR<1> may be enabled to have a logic "high" level so that the information on a high frequency operation included in the set codes SCD<1:M> is stored in the first storage unit 232. If the input control code WR_CD has a logic "low" level and the output control code OP_CD has a logic "high" level, the first output control signal OP<1> may be enabled to have a logic "high" level so that the information on a high frequency operation stored in the first storage unit 232 may be outputted as the selection information signal SD_SEL. If the input control code WR_CD has a logic "high" level and the output control code OP_CD have a logic "low" level, the second input control signal WR<2> may be enabled to have a logic "high" so that the information on a low frequency operation included in the set codes SCD<1:M> is stored in the second storage unit 233. If both of the input control code WR_CD and the output control code OP_CD have a logic "high" level, the second output control signal OP<2> may be enabled to have a logic "high" level so that the information on a low frequency operation stored in the second storage unit 233 may be outputted as the selection information signal SD_SEL.

Figure 4:
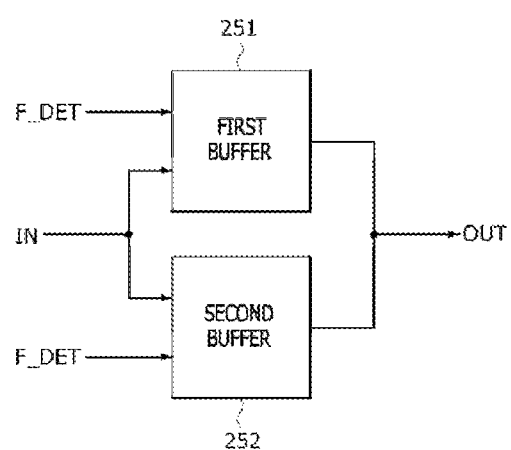
FIG. 4 is a block diagram illustrating a representation of an example of an operation control circuit included in the semiconductor system of FIG. 1.

Referring to FIG. 4, the operation control circuit 25 may include a first buffer 251 and a second buffer 252. The first buffer 251 may buffer an input signal IN to output the buffered signal as an output signal OUT, in response to the frequency determination signal F_DET. The second buffer 252 may buffer the input signal IN to output the buffered signal as the output signal OUT, in response to the frequency determination signal F_DET. Operations of the first and second buffers 251 and 252 may be controlled by the frequency determination signal F_DET. For example, the first buffer 251 may operate if the frequency determination signal F_DET has a logic "high" level, and the second buffer 252 may operate if the frequency determination signal F_DET has a logic "low" level. The first buffer 251 may buffer the input signal IN to output the buffered signal as the output signal OUT if the operation frequency of the semiconductor system is set to be a high frequency, and the second buffer 252 may buffer the input signal IN to output the buffered signal as the output signal OUT if the operation frequency of the semiconductor system is set to be a low frequency. In such an example, a drivability of the first buffer 251 may be set to be higher than a drivability of the second buffer 252. If the operation frequency of the semiconductor system is set to be a high frequency, the first buffer 251 may buffer the input signal IN to output the buffered signal as the output signal OUT because the first buffer 251 having a drivability which is higher than that of the second buffer 252 operates while the second buffer 252 does not operate. Thus, a speed of the operation that the input signal IN is buffered and outputted as the output signal OUT may be improved. If the operation frequency of the semiconductor system is set to be a low frequency, the second buffer 252 may buffer the input signal IN to output the buffered signal as the output signal OUT because the second buffer 252 having a drivability which is lower than that of the first buffer 251 operates while the first buffer 251 does not operate. Thus, a power consumption of the operation control circuit 25 may be reduced. In some other embodiments, the operation control circuit 25 may be realized so that both of the first and second buffers 251 and 252 operate if the frequency determination signal F_DET has a logic "high" level and only the second buffer 252 operates if the frequency determination signal F_DET has a logic "low" level. In such an example, if the operation frequency of the semiconductor system is set to be a high frequency, a speed of the operation that the input signal IN is buffered and outputted as the output signal OUT may be improved because both of the first and second buffers 251 and 252 operate. If the operation frequency of the semiconductor system is set to be a low frequency, a power consumption of the operation control circuit 25 may be reduced because only the second buffer 252 of the first and second buffers 251 and 252 operates.

Figure 5:
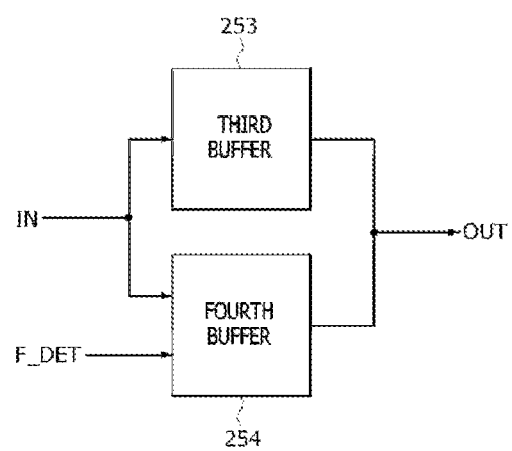
FIG. 5 is a block diagram illustrating a representation of another example of an operation control circuit included in the semiconductor system of FIG. 1.

Referring to FIG. 5, the operation control circuit 25a may include a third buffer 253 and a fourth buffer 254. The third buffer 253 may buffer the input signal IN to output the buffered signal as the output signal OUT. The fourth buffer 254 may buffer the input signal IN to output the buffered signal as the output signal OUT, in response to the frequency determination signal F_DET. For example, the fourth buffer 254 may buffer the input signal IN to output the buffered signal as the output signal OUT if the frequency determination signal F_DET has a logic "high" level and may stop the buffering operation thereof if the frequency determination signal F_DET has a logic "low" level. That is, the fourth buffer 254 may operate to buffer and output the input signal IN as the output signal OUT only when the operation frequency of the semiconductor system is set to be a high frequency. As a result, if the operation frequency of the semiconductor system is set to be a high frequency, both of the third and fourth buffers 253 and 254 of the operation control circuit 25a illustrated in FIG. 5 may operate to improve a speed of the operation that the input signal IN is buffered and outputted as the output signal OUT. If the operation frequency of the semiconductor system is set to be a low frequency, only the third buffer 253 may operate while the fourth buffer 254 does not operate. Thus, a power consumption of the operation control circuit 25a may be reduced.

Figure 6:
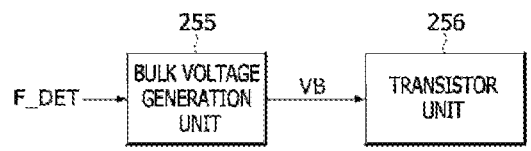
FIG. 6 is a block diagram illustrating a representation of another example of an operation control circuit included in the semiconductor system of FIG. 1.

Referring to FIG. 6, the operation control circuit 25b may include a bulk voltage generation unit 255 and a transistor unit 256. The bulk voltage generation unit 255 may adjust a level of a bulk voltage VB in response to the frequency determination signal F_DET. For example, the bulk voltage generation unit 255 may receive the frequency determination signal F_DET having a logic "high" level to lower a level of the bulk voltage VB if the operation frequency of the semiconductor system is set to be a high frequency, and the bulk voltage generation unit 255 may receive the frequency determination signal F_DET having a logic "low" level to increase a level of the bulk voltage VB if the operation frequency of the semiconductor system is set to be a low frequency. A level of the bulk voltage VB outputted from the bulk voltage generation unit 255 may be adjusted to be different according to a logic level of the frequency determination signal F_DET. For example, the bulk voltage generation unit 255 may set a level of the bulk voltage VB to a high level in response to the frequency determination signal F_DET if the operation frequency of the semiconductor system is set to be a high frequency so that the frequency determination signal F_DET has a logic "high" level, and the bulk voltage generation unit 255 may set a level of the bulk voltage VB to a low level in response to the frequency determination signal F_DET if the operation frequency of the semiconductor system is set to be a low frequency so that the frequency determination signal F_DET has a logic "low" level.

The transistor unit 256 may receive the bulk voltage VB to control a drivability of at least one MOS transistor (not illustrated) included therein. For example, a threshold voltage of the at least one MOS transistor included in the transistor unit 256 may be lowered by the bulk voltage VB which is set to have a low level if the operation frequency of the semiconductor system is set to be a high frequency. Thus, an operation speed of the at least one MOS transistor may be improved. In an embodiment, a threshold voltage of the at least one MOS transistor included in the transistor unit 256 may be increased by the bulk voltage VB which is set to have a high level if the operation frequency of the semiconductor system is set to be a low frequency. Thus, an operation speed of the at least one MOS transistor may be degraded. As a result, if the operation frequency of the semiconductor system is set to be a high frequency, an operation speed of at least one MOS transistor constituting the transistor unit 256 may become faster to improve an operation speed of the semiconductor device 2. If the operation frequency of the semiconductor system is set to be a low frequency, an operation speed of at least one MOS transistor constituting the transistor unit 256 may become slower to reduce the power consumption of the semiconductor device 2. The bulk voltage VB may correspond to a back gate bias which is applied to a body region of the MOS transistor.

Figure 7:
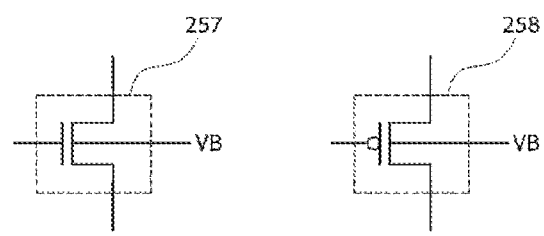
FIG. 7 is a circuit diagram illustrating a representation of an example of a transistor unit included in the operation control circuit of FIG. 6.

Referring to FIG. 7, the transistor unit 256 may include a first MOS transistor 257 and a second MOS transistor 258. The first MOS transistor 257 may be realized using, for example but not limited to, an N-channel MOS transistor having a drivability controlled by the bulk voltage VB. The second MOS transistor 257 may be realized using, for example but not limited to, a P-channel MOS transistor whose drivability is controlled by the bulk voltage VB. If the operation frequency of the semiconductor system is set to be a high frequency, a threshold voltage of the first MOS transistor 257 and a threshold voltage of the second MOS transistor 258 may be lowered to improve an operation speed of the transistor unit 256. If the operation frequency of the semiconductor system is set to be a low frequency, a threshold voltage of the first MOS transistor 257 and a threshold voltage of the second MOS transistor 258 may be increased to degrade an operation speed of the transistor unit 256. In some embodiments, the transistor unit 256 may be realized to include, for example, at least two P-channel MOS transistors and at least two N-channel MOS transistors.

Figure 8:
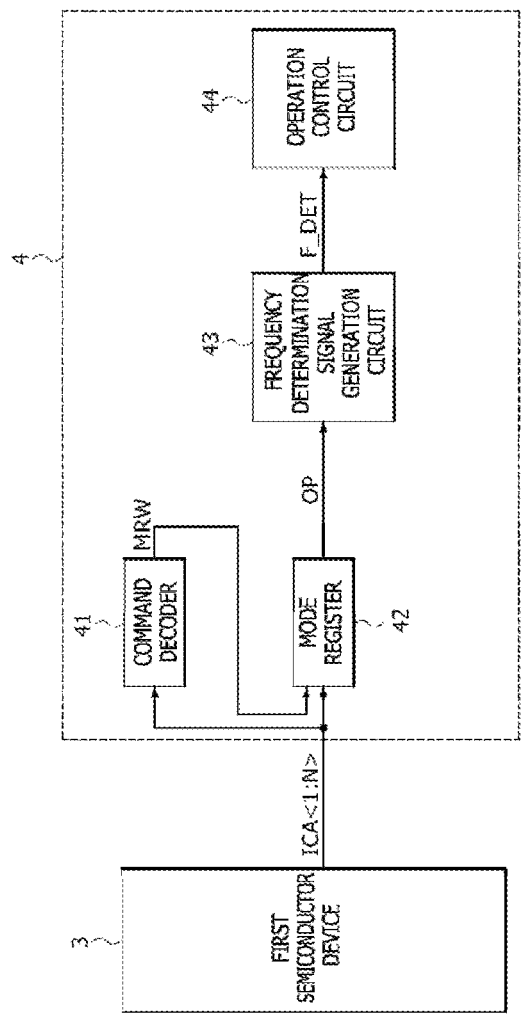
FIG. 8 is a block diagram illustrating a representation of an example of a configuration of a semiconductor system according to an embodiment.

Referring to FIG. 8, a semiconductor system according to an embodiment may include a first semiconductor device 3 and a second semiconductor device 4.

The first semiconductor device 3 may output set signals ICA<1:N>. The set signals ICA<1:N> may be set to have various logic level combinations. A mode register write command MRW may be enabled or disabled according to a logic level combination of the set signals ICA<1:N>. The set signals ICA<1:N> may include information on an operation frequency of the semiconductor system. At least one bit of a plurality of bits included in the set signals ICA<1:N> may be set to correspond to the information on an operation frequency of the semiconductor system. The set signals ICA<1:N> may be transmitted through lines that transmit commands or simultaneously transmit the commands and addresses. The number of bits included in the set signals ICA<1:N> may be set differently according to the embodiments.

The second semiconductor device 4 may include a command decoder 41, a mode register 42, a frequency determination signal generation circuit 43 and an operation control circuit 44.

The command decoder 41 may receive the set signals ICA<1:N> to generate the mode register write command MRW. For example, the command decoder 41 may generate the mode register write command MRW which is enabled if the set signals ICA<1:N> having a predetermined logic level combination is inputted thereto. In some embodiments, the command decoder 41 may receive signals of some bits among a plurality of bits included in the set signals ICA<1:N> to generate the mode register write command MRW. A logic level of the enabled mode register write command MRW may be set differently according to the embodiments.

The mode register 42 may extract and store information on the operation frequency from the set signals ICA<1:N> and may output the information on the operation frequency, in response to the mode register write command MRW. For example, the mode register 42 may extract and store the information on the operation frequency included in the set signals ICA<1:N> and may output the information on the operation frequency as an information signal OP, if the mode register write command MRW is enabled. The information signal OP may be set to have a logic "high" level if the operation frequency is set to a high frequency and may be set to have a logic "low" level if the operation frequency is set to a low frequency. A logic level of the information signal OP according to the operation frequency may be set differently according to the embodiments. A design scheme for extracting the information signal OP from the set signals ICA<1:N> may be set differently according to the embodiments. For example, in some embodiments, the information signal OP may be included in the set signals ICA<1:N> without any signal processing and may be transmitted by sending the set signals ICA<1:N>. In an embodiment, the information signal OP may be processed by a signal processor and the processed information signal OP may be transmitted together with the set signals ICA<1:N>. The information signal OP may be realized to have at least two bits according to the embodiments. The mode register 42 may be realized to receive only some bits among a plurality of bits included in the set signals ICA<1:N> for extraction and output of the information signal OP.

The frequency determination signal generation circuit 43 may generate a frequency determination signal F_DET in response to the information signal OP. For example, the frequency determination signal generation circuit 43 may generate the frequency determination signal F_DET having a logic "high" level if the information signal OP has a logic "high" level and may generate the frequency determination signal F_DET having a logic "low" level if the information signal OP has a logic "low" level. A logic level of the frequency determination signal F_DET generated from the frequency determination signal generation circuit 43 according to a logic level of the information signal OP may be set differently according to the embodiments. The semiconductor system may operate at a high frequency if the frequency determination signal F_DET has a logic "high" level and may operate at a low frequency if the frequency determination signal F_DET has a logic "low" level. The operation frequency of the semiconductor system determined according to a logic level of the frequency determination signal F_DET may be set differently according to the embodiments.

The operation control circuit 44 may control the semiconductor system in response to the frequency determination signal F_DET so that the semiconductor system operates at a high frequency or a low frequency. For example, the operation control circuit 44 may control the semiconductor system so that the semiconductor system operates at a high frequency if the frequency determination signal F_DET has a logic "high" level and operates at a low frequency if the frequency determination signal F_DET has a logic "low" level. The operations controlled by the operation control circuit 44 according to a logic level of the frequency determination signal F_DET may be set differently according to the embodiments. The operations executed at a high frequency may include an operation for increasing a drivability of a buffer circuit (not illustrated) and an operation for lowering a threshold voltage of MOS transistors (not illustrated) to improve an operation speed of the MOS transistors. In an embodiment, the operations executed at a low frequency may include an operation for reducing a drivability of the buffer circuit and an operation for increasing a threshold voltage of the MOS transistors to degrade an operation speed of the MOS transistors. The operation control circuit 44 may be realized to have any one of various configurations described with reference to FIGS. 4 to 7. Thus, a configuration and a operation of the operation control circuit 44 will be omitted hereinafter.

Figure 9:
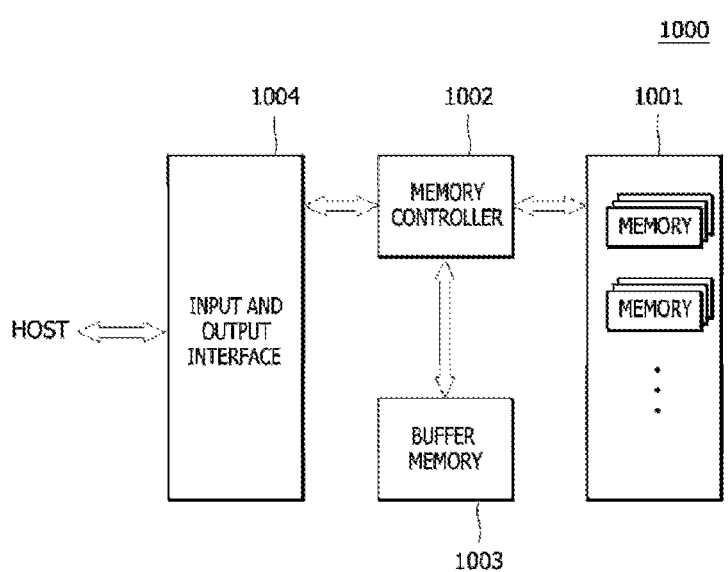
FIG. 9 is a block diagram illustrating a representation of an example of an electronic system including any one of the semiconductor systems illustrated in FIGS. 1 to 8.

At least one of the semiconductor devices or at least one of the semiconductor systems described with reference to FIGS. 1 to 8 may be applied to an electronic system including, for example, a memory system, a graphic system, a computing system, a mobile system, or the like. For example, an electronic system 1000 according an embodiment may include a data storage unit 1001, a memory controller 1002, a buffer memory 1003, and an I/O interface 1004, as illustrated in FIG. 9.

The data storage unit 1001 may store data outputted from the memory controller 1002 or may read and output the stored data to the memory controller 1002, according to a control signal generated from the memory controller 1002. The data storage unit 1001 may include the second semiconductor device 2 illustrated in FIG. 1 and/or the second semiconductor device 4 illustrated in FIG. 8. The data storage unit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage unit 1001 or the buffer memory 1003 or for outputting the data stored in the data storage unit 1001 or the buffer memory 1003. The memory controller 1002 may include the first semiconductor device 1 illustrated in FIG. 1 and/or the first semiconductor device 3 illustrated in FIG. 8. Although FIG. 9 illustrates the memory controller 1002 with a single block, the memory controller 1002 may include one controller for controlling the data storage unit 1001 comprised of a nonvolatile memory and another controller for controlling the buffer memory 1003 comprised of a volatile memory.

The buffer memory 1003 may temporarily store the data processed by the memory controller 1002. The buffer memory 1003 may temporarily store the data outputted from or to be inputted to the data storage unit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. The electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include, for example but not limited to, a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor system comprising:
    a first semiconductor device configured to output set signals; and
    a second semiconductor device configured to generate a start signal in response to the set signals, configured to generate an input control code and an output control code from the set signals in response to the start signal, configured to generate a frequency determination signal including information on an operation frequency in response to the output control code, and configured to control an internal operation in response to the frequency determination signal.

2. The semiconductor system of claim 1,
    wherein the first semiconductor device is configured for outputting set codes, and
    wherein the set signals and the set codes are transmitted through a line configured to transmit at least one group among addresses, commands and data.

3. The semiconductor system of claim 1, wherein the second semiconductor device includes a code extraction circuit configured for generating the input control code and the output control code, one of either the input control code or the output control code is selectively enabled according to a logic level combination of the set signals if the start signal is enabled.

4. The semiconductor system of claim 1,
    wherein the first semiconductor device is configured for outputting set codes, and
    wherein the second semiconductor device includes an information storage circuit configured for extracting and storing operation information according to a frequency from the set codes in response to the input control code and the output control code.

5. The semiconductor system of claim 4, wherein the information storage circuit includes:
    an input/output (I/O) control signal generation unit configured to generate a first input control signal, a second input control signal, a first output control signal and a second output control signal in response to the input control code and the output control code;
    a first storage unit configured to store first information on a first frequency operation included in the set codes and configured to output the first information stored therein as a first storage signal, in response to the first input control signal and the first output control signal; and
    a second storage unit configured to store second information on a second frequency operation included in the set codes and configured to output the second information stored therein as a second storage signal, in response to the second input control signal and the second output control signal.

6. The semiconductor system of claim 5,
wherein the first input control signal is enabled if a logic level combination of the input control code and the output control code is a first logic level combination;
wherein the first output control signal is enabled if a logic level combination of the input control code and the output control code is a second logic level combination;
wherein the second input control signal is enabled if a logic level combination of the input control code and the output control code is a third logic level combination; and
wherein the second output control signal is enabled if a logic level combination of the input control code and the output control code is a fourth logic level combination.

7. The semiconductor system of claim 5, wherein the first storage unit is configured to store the first information if the first input control signal is enabled and is configured to output the first information stored therein as the first storage signal if the first output control signal is enabled.

8. The semiconductor system of claim 1,
wherein the second semiconductor device includes an operation control circuit, and
wherein a drivability of the operation control circuit is controlled by the frequency determination signal.

9. The semiconductor system of claim 8, wherein the operation control circuit includes:
a first buffer configured for buffering an input signal to output the buffered signal as an output signal in response to the frequency determination signal; and
a second buffer configured for buffering the input signal to output the buffered signal as the output signal in response to the frequency determination signal.

10. The semiconductor system of claim 9, wherein a drivability of the first buffer is set higher than a drivability of the second buffer.

11. The semiconductor system of claim 10, wherein if an operation frequency of the semiconductor system is set to a high frequency the first buffer operates to buffer the input signal while the second buffer does not operate, and
wherein if the operation frequency of the semiconductor system is set to a low frequency the second buffer operates to buffer the input signal while the first buffer does not operate.

12. The semiconductor system of claim 10,
wherein the operation control circuit is configured to operate only the first buffer if the frequency determination signal has a logic high level, and
wherein the operation control circuit is configured to operate only the second buffer if the frequency determination signal has a logic low level.

13. The semiconductor system of claim 9, wherein the operation control circuit is configured to operate both the first and second buffers if the frequency determination signal has a logic high level and only the second buffer operates if the frequency determination signal has a logic low level.

14. The semiconductor system of claim 8, wherein the operation control circuit includes:
a first buffer configured for buffering an input signal to output the buffered signal as an output signal; and
a second buffer configured for buffering the input signal to output the buffered signal as the output signal in response to the frequency determination signal.

15. The semiconductor system of claim 14,
wherein the operation control circuit is configured to operate both the first and second buffers if the frequency determination signal has a logic high level, and
wherein the operation control circuit is configured to operate only the second buffer if the frequency determination signal has a logic low level.

16. The semiconductor system of claim 1,
wherein the second semiconductor device includes an operation control circuit having at least one MOS transistor, and
wherein a threshold voltage of the at least one MOS transistor is adjustable by the frequency determination signal.

17. The semiconductor system of claim 16, wherein the operation control circuit includes:
a bulk voltage generation unit configured to generate a bulk voltage, and a level of the bulk voltage is controlled by the frequency determination signal; and
a transistor unit including at least one MOS transistor, a threshold voltage of the at least one MOS transistor of the transistor unit is adjustable by the bulk voltage.

18. The semiconductor system of claim 16, wherein the bulk voltage is applied to a body region of the MOS transistor of the transistor unit.

19. A semiconductor system comprising:
a first semiconductor device configured for outputting set signals; and
a second semiconductor device configured to generate a mode register write command in response to the set signals, configured to extract and store an information signal including information on an operation frequency from the set signals in response to the mode register write command, configured to generate a frequency determination signal from the information signal, and configured to control an internal operation in response to the frequency determination signal.

20. The semiconductor system of claim 19, wherein the set signals are transmitted through a line configured to transmit at least one group among addresses, commands and data.

21. The semiconductor system of claim 19, wherein the second semiconductor device includes a mode register configured for extracting and storing the information signal from the set signals if the mode register write command is enabled.

22. The semiconductor system of claim 19,
wherein the second semiconductor device includes an operation control circuit, and
wherein a drivability of the operation control circuit is controlled by the frequency determination signal.

23. The semiconductor system of claim 19,
wherein the second semiconductor device includes an operation control circuit having at least one MOS transistor, and
wherein a threshold voltage of the at least one MOS transistor is adjustable by the frequency determination signal.

24. A semiconductor device comprising:
a code extraction circuit configured for generating an input control code and an output control code in response to set signals;
a frequency determination signal generation circuit configured for generating a frequency determination signal including information on an operation frequency in response to the output control code; and
an operation control circuit configured for controlling an internal operation in response to the frequency determination signal.

25. The semiconductor device of claim 24, wherein a drivability of the operation control circuit is controlled by the frequency determination signal.

26. The semiconductor device of claim 25, wherein the operation control circuit includes:
   a first buffer configured for buffering an input signal to output the buffered signal as an output signal in response to the frequency determination signal; and
   a second buffer configured for buffering the input signal to output the buffered signal as the output signal in response to the frequency determination signal.

27. The semiconductor device of claim 25, wherein the operation control circuit includes:
   a first buffer configured for buffering an input signal to output the buffered signal as an output signal; and
   a second buffer configured for buffering the input signal to output the buffered signal as the output signal in response to the frequency determination signal.

28. The semiconductor device of claim 24,
   wherein the operation control circuit includes at least one MOS transistor, and
   wherein a threshold voltage of the at least on MOS transistor is adjustable by the frequency determination signal.

29. The semiconductor device of claim 28, wherein the operation control circuit includes:
   a bulk voltage generation unit configured to generate a bulk voltage, and a level of the bulk voltage is controlled by the frequency determination signal; and
   a transistor unit including at least one MOS transistor, and a threshold voltage of the at least one MOS transistor of the transistor unit is adjustable by the bulk voltage.

30. A semiconductor device comprising:
   a mode register configured for extracting and storing an information signal from set signals in response to a mode register write command;
   a frequency determination signal generation circuit configured for generating a frequency determination signal including information on an operation frequency from the information signal; and
   an operation control circuit configured for controlling an internal operation in response to the frequency determination signal.

31. The semiconductor device of claim 30, wherein a drivability of the operation control circuit is controlled by the frequency determination signal.

32. The semiconductor device of claim 31, wherein the operation control circuit includes:
   a first buffer configured for buffering an input signal to output the buffered signal as an output signal in response to the frequency determination signal; and
   a second buffer configured for buffering the input signal to output the buffered signal as the output signal in response to the frequency determination signal.

33. The semiconductor device of claim 31, wherein the operation control circuit includes:
   a first buffer configured for buffering an input signal to output the buffered signal as an output signal; and
   a second buffer configured for buffering the input signal to output the buffered signal as the output signal in response to the frequency determination signal.

34. The semiconductor device of claim 30,
   wherein the operation control circuit includes at least one MOS transistor, and
   wherein a threshold voltage of the at least one MOS transistor is adjustable by the frequency determination signal.

35. The semiconductor device of claim 34, wherein the operation control circuit includes:
   a bulk voltage generation unit configured to generate a bulk voltage, and a level of the bulk voltage is controlled by the frequency determination signal; and
   a transistor unit including at least one MOS transistor, and a threshold voltage of the at least one MOS transistor is adjustable by the bulk voltage.

36. A semiconductor system comprising:
   a first semiconductor device configured to output set signals; and
   a second semiconductor device including:
      a frequency determination signal generation circuit configured for generating a frequency determination signal including information on an operation frequency in response to set signals; and
      an operation control circuit configured for controlling an internal operation in response to the frequency determination signal.

37. The semiconductor system of claim 36,
   wherein the operation control circuit includes a first buffer configured for buffering an input signal to output a buffered signal as an output signal,
   wherein the operation control circuit includes a second buffer configured for buffering the input signal to output the buffered signal as the output signal, and
   wherein if an operation frequency of the semiconductor system is set to a high frequency the only first buffer operates to buffer the input signal, and
   wherein if the operation frequency of the semiconductor system is set to a low frequency only the second buffer operates to buffer the input signal.

38. The semiconductor system of claim 36,
   wherein the operation control circuit includes a first buffer configured for buffering an input signal to output a buffered signal as an output signal,
   wherein the operation control circuit includes a second buffer configured for buffering the input signal to output the buffered signal as the output signal, and
   wherein if an operation frequency of the semiconductor system is set to a high frequency the first and second buffers operate to buffer the input signal, and
   wherein if the operation frequency of the semiconductor system is set to a low frequency only the second buffer operates to buffer the input signal.

* * * * *